United States Patent
Boemler et al.

(10) Patent No.: US 6,965,407 B2
(45) Date of Patent: Nov. 15, 2005

(54) IMAGE SENSOR ADC AND CDS PER COLUMN

(75) Inventors: Christian Boemler, Cortland, NY (US); Jeffrey J. Zarnowski, McGraw, NY (US)

(73) Assignee: Silicon Video, Inc., Ithaca, NY (US)

( * ) Notice: Subject to any disclaimer, the term of this patent is extended or adjusted under 35 U.S.C. 154(b) by 570 days.

(21) Appl. No.: 10/106,399

(22) Filed: Mar. 25, 2002

(65) Prior Publication Data

US 2002/0167611 A1 Nov. 14, 2002

Related U.S. Application Data

(60) Provisional application No. 60/278,639, filed on Mar. 26, 2001.

(51) Int. Cl.[7] .......................... H04N 3/14; H04N 5/335
(52) U.S. Cl. ................. 348/302; 348/573; 250/208.1
(58) Field of Search ................. 348/302, 572–573; 341/155, 144; 250/208.1

(56) References Cited

U.S. PATENT DOCUMENTS

| | | | | |
|---|---|---|---|---|
| 3,683,369 A | * | 8/1972 | Stern | 341/169 |
| 3,961,325 A | * | 6/1976 | Kendall et al. | 341/120 |
| 4,978,958 A | * | 12/1990 | Walker | 341/159 |
| 5,877,715 A | * | 3/1999 | Gowda et al. | 341/122 |
| 5,880,691 A | * | 3/1999 | Fossum et al. | 341/162 |
| 6,067,113 A | | 5/2000 | Hurwitz et al. | 348/241 |
| 6,084,229 A | * | 7/2000 | Pace et al. | 250/208.1 |
| 6,115,066 A | * | 9/2000 | Gowda et al. | 348/308 |
| 6,423,957 B1 | * | 7/2002 | Kim et al. | 250/208.1 |
| 6,433,822 B1 | * | 8/2002 | Clark et al. | 348/241 |
| 6,583,817 B1 | * | 6/2003 | Lee | 348/241 |

* cited by examiner

*Primary Examiner*—Tuan Ho
*Assistant Examiner*—Hung Lam
(74) *Attorney, Agent, or Firm*—Bernhard P. Molldrem, Jr.

(57) ABSTRACT

A solid state imager includes an arrangement for converting analog pixel values to digital form on an arrayed per-column basis. An N-bit counter supplies an N-bit DAC to produce an analog ramp output providing a ramp signal with a level that varies corresponding to the contents of the counter. Latches or equivalent digital storage elements are each associated with a respective column. A counter bus connects the counter to latch inputs of said latches, and comparators associated the columns gate the latches when the analog ramp equals the pixel value for that column. The contents of the latch elements are transferred sequentially to a video output bus to produce the digital video signal. There can be additionally black-level readout latch elements, for storing a digital value that corresponds to the dark or black video level, and a subtraction element subtracts the black level value from the pixel value to reduce fixed pattern noise. An additional array of buffer latches can be employed.

10 Claims, 7 Drawing Sheets

FIG.4A SAMPLE-AND-HOLD

FIG.4B READOUT_CLOCK

FIG.4C

FIG.4D RESET_PEAK

IMAGE SENSOR ADC AND CDS PER COLUMN

This application claims the benefit of Provisional Application No. 60/278,639, filed Mar. 26, 2001.

BACKGROUND OF THE INVENTION

This invention relates to solid state imaging devices, and is more specifically directed to an imager that converts analog pixel values to corresponding digital values on an arrayed basis, with significantly reduced circuitry. The invention is also concerned with compensation of errors that may be present in conversion, as well as correction for offset errors attributable to the pixel photo sensor areas or to the pixel amplifiers.

DESCRIPTION OF THE PRIOR ART

The term "array" used herein refers to any kind of repeatable circuit and covers for instance a circuit per column or a circuit per row in an area (two-dimensional) sensor, or an entire line in a linear sensor (theoretically a one-pixel by N-pixel area sensor). Alternatively the term "array" could embrace every pixel in an image sensor.

A dominant factor in integrated circuit design is the silicon area utilized for a given circuit implementation and thus good circuit design requires minimizing the size of any circuit as much as possible. Any kind of arrayed circuit is a major contributor to the overall utilized silicon area, so for large arrays it is advantageous to reduce the amount of arrayed circuit. There is continuing higher demand for solid state imagers with a reduced power consumption, increased read-out speeds, smaller line intervals, higher sensitivity in the pixel amplifiers, lower FPN (fixed pattern noise), higher signal to noise ratios (SNR) and denser pixel-(and thus array-) pitches.

The majority of the present-day image sensors designs employ one or more analog bus(ses) in order to sequentially scan the signals stored in a very large array. Wide-bus analog multiplexing has significant problems due, for example, to highly capacitive loads, long settling times, voltage droop across the bus, noise cross coupling from neighboring circuits. At the same time, the highly capacitive bus is driven by a circuit with an analog supply that will suffer from the sudden surge in analog current while changing the voltage on the bus to the newly selected pixel. That surge in the analog current can inject a significant amount of noise to the highly sensitive pixel site or pixel amplifier voltage storage nodes. Finally, if the arrayed analog buffer has to be able to drive the capacitive bus (even at moderate speeds) it will need a higher quiescent supply current in the output stage and that current gets multiplied by the number of arrayed elements to yield a very high undesired power consumption for the entire array.

If A/D-converter digitizing could be implemented per arrayed circuit, the video bus multiplexing can be done in the digital domain with sharply improved noise immunity, as compared to an analog bus. There are many other advantages inherent in a digital video multiplexer as opposed to an analog video multiplexer; for example, digital logic has significantly smaller transistors, with no quiescent power consumption; there are no mismatch issues which might lead to added fixed pattern noise (FPN); and digital circuits provide excellent capacitive driving capability and an additional ability to do pipelining for increased speed.

A serious problem for analog arrayed circuits is that any mismatch between the devices will appear as fixed pattern noise (i.e., offset variations from one circuit in the array to the next). As the pixel pitch decreases the analog array pitch decreases as well, because any asymmetry in the array will show up as FPN. As the analog array pitch decreases it becomes difficult or placing them in proximity and utilize dummy devices in order to make dependant devices similar in their electric parameters. This problem, however, would be absent in digital implementations.

Gain variations in CMOS and other solid-state analog imaging devices are virtually eliminated using an Active Column Sensor (ACS) approach (See U.S. Pat. No. 6,084,229, Jul. 4, 2000). Offset errors are cancelled out from the arrayed devices using a correlated double sampling (CDS) technique, where the pixel reset (black-level voltage) is subtracted from the sampled video voltage. Any common-mode errors present within the arrayed circuits are thus compensated. Conventional CMOS imagers do not use true CDS, in which the reset voltage is sampled before exposure and is subtracted from the video signal sampled after the exposure. Instead a DS (double sampling) is used, where the video signal is sampled after exposure, the pixel is reset and the reset voltage is then sampled and subtracted from the sampled video signal. True CDS eliminates the thermal or temporal (kTC) noise arising from resetting the pixel and also eliminates offset errors in the amplifiers and pixels. DS eliminates offset errors but also introduces $\sqrt{2}$ times more kTC noise (rms). Straightforward DS is often justified economically, in practical implementations, because offset errors which appear as FPN are more degrading to the perception of a scanned image than the randomized kTC noise.

Prior arrayed AD-converters typically employ a Successive Approximation Register (SAR) technique, that uses a bisectional search algorithm to find the digital pixel value (see, e.g. U.S. Pat. No. 4,978,958). An N-bit SAR Analog-to-Digital Converter (ADC) is for instance constructed from an N-bit Analog-to-Digital Converter (DAC), or similar device, a comparator, a controller and one or more N-bit registers per arrayed element. Thus the SAR ADC suffers deficiencies with respect to size, accuracy and power consumption. An N-bit SAR ADC can digitize to an analog signal in $2^N$ clock cycles compared to an N-bit Flash or pipelined flash that digitizes the signal in one or a few clock cycle(s). These clock cycles add to the line-period when digitizing the signal before read-out.

An objective of this invention over, for instance the ADC of U.S. Pat. No. 3,683,369 is to achieve a particular benefit over arrayed AD-converters by minimizing the number of arrayed analog devices needed. Also, that the analog ramp in this invention is generated by a non-arrayed DAC with the input to the DAC being a digital count, rather than the less accurate method of relying on the time from the start of an analog generated ramp and until the ramp has passed the analog input voltage.

An attempt to minimize the power and size of arrayed ADCs over conventional SARs is discussed in U.S. Pat. No. 5,880,691, where the DAC is made from various sized capacitors and was intended to achieve a significant reduction in power consumption. However, this is still an SAR design, and consumes much of the available device area.

U.S. Pat. No. 3,961,325 discusses advantages of arrayed AD-converters by using a ramp to feed an array of single comparators, but is focused on means of controlling an analog generated ramp so that it is in sync with a binary counter. Unlike the present invention, The ADC of the prior patent cannot rely on a single DAC to generate the ramp from a single counter, and cannot have the very same counter value latched throughout in all the array circuits as the digitized values. This synchronization is a serious problem, whereas proper synchronization is a given in this invention. Furthermore, the prior ADC circuits fail to address the problem of offset errors or FPN. With the prior techniques, it is difficult to reduce the size of the analog portions of the digitizing circuitry. However, in this invention, the analog part of the arrayed circuits can be made as small as possible with higher offset error variations allowed, and the absence of properly matched analog devices in the array ceases to be a problem.

OBJECTS AND SUMMARY OF THE INVENTION

Accordingly, it is an object of the present invention to provide a straightforward technique for converting the video pixel signals from a solid state imaging device to a digital video signal, and to achieve the same on-chip with an array that consumes a minimum of available area, and which avoids drawbacks of the prior art.

It is another object to provide a solid state imager with an arrayed ADC functionality, and which also compensates for offsets and eliminates or reduces FPN.

According to a preferred embodiment of this invention, an ADC arrangement converts analog pixel values from an array of pixels to a digital video signal. The array is formed, for example, of a plurality of columns and at least one row, with each column having at one pixel, and with each column having a column amplifier that provides a respective pixel value. In the ADC arrangement there is an N-bit counter; an N-bit DAC connected to the counter output and the DAC has a ramp output providing a signal proportional to a count existing on said counter. A plurality of latch elements are each associated with a respective column. A counter bus connects an output of the counter to latch inputs of the several latch elements. A plurality of comparators are each associated with a respective one of the column amplifiers, and have one input connected to the respective column amplifier, another input connected to the ramp output of the N-bit counter, and a comparator output connected to a gating terminal of the respective latch element. A video readout bus follows these latch elements, and a switch array or other equivalent means selectively transfer the contents of the latch elements to video output bus to produce the digital video signal. In this invention, each signal in the array is compared with a common ramp, and the comparator output is used to latch the digital value that generated the same ramp. Bringing a video readout into the digital domain presents a myriad of advantages such as higher speed, lower noise and lower power. The invention also presents a variety of digital readout schemes with different speed/size tradeoffs and means to do DS and even true CDS in the digital domain to compensate for offset variations in the array. Compensation for offset errors can be easily achieved, including errors that arise from the conversion in addition to offsets between pixel amplifiers.

The ADC arrangement can compensate for FPN. To this end, a plurality of black-level readout latch elements are each associated with a respective one of the columns. Each black level readout latch element has a latch input connected to the counter bus and a gating terminal connected to the respective black-level comparator output. There is a black-level readout bus, and means for transferring the contents of the respective black-level latch elements to the black-level readout bus simultaneously with the transfer of the contents of the first-mentioned latch elements to the video readout bus. A subtraction element connected to the video readout bus and the black-level readout bus then subtracts the black-level values, to eliminate offset as between the column amplifiers. In a preferred mode, the latch elements can each include a first latch member having an input connected to the counter bus, and a second, buffer latch member, with an input connected to an output of the respective first latch member, a gate terminal, and an output connected to the video readout bus. In this case there are means providing a transfer signal to the gate terminals of the buffer latch members.

The above and many other objects, features, and advantages of this invention can be achieved and will become apparent from a consideration of the following description of selected preferred embodiments, which are to be read in connection with the accompanying Drawing.

DETAILED DESCRIPTION OF THE PREFERRED EMBODIMENTS

Figures 1, 2A:
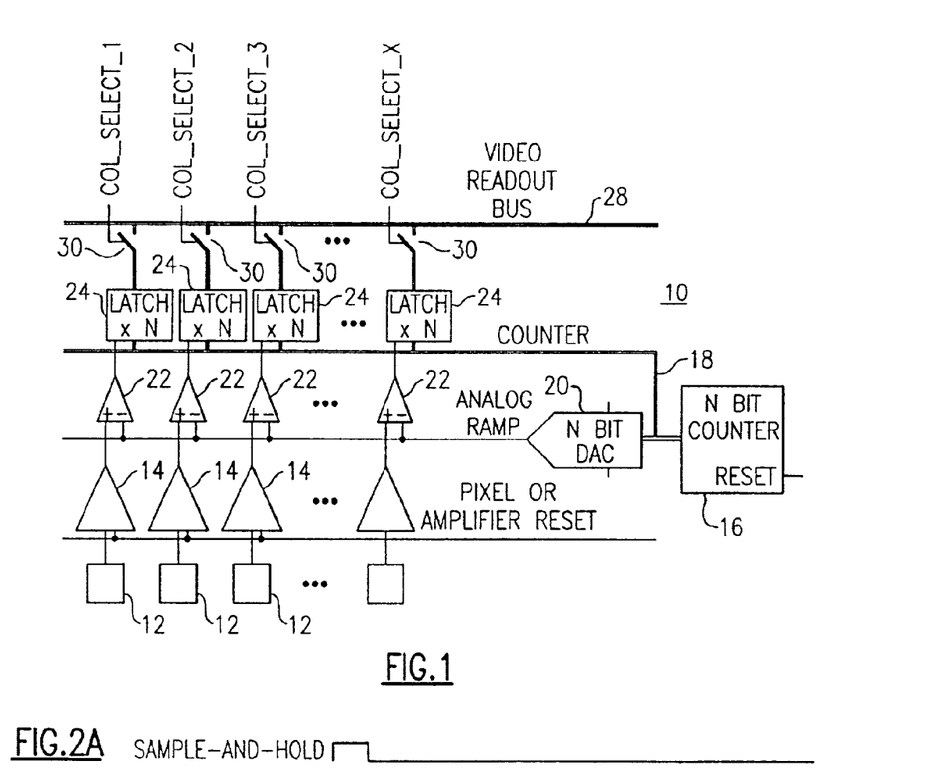
FIG. 1 is a schematic circuit diagram of a solid state imager employing an arrayed ADC according to one preferred embodiment of this invention.
FIGS. 2A to 2D are signal charts for explaining the operation of this embodiment.

With reference to the Drawing figures, and initially to FIG. 1 thereof, an arrayed solid-state imager 10 is shown, which incorporates an N-bit ADC conversion facility that employs an N-bit counter and a DAC to generate an analog ramp.

In this imager 10, there are multiple columns, each comprising one or more pixels 12. In this case the pixel 12 represents one or multiple pixels of the same column, and each pixel 12 is connected with an input of a column amplifier 14. A pixel reset line is also connected to a reset input of each of the column amplifiers 14. An N-bit counter 16 counts up clock signals and supplies a digital count value on a counter output bus 18 that supplies an input of a DAC or digital-to-analog converter element 20. In this embodiment a low count value corresponds to a video dark or black value, while a high count value corresponds to white. The DAC 20 creates a ramp voltage output that steps up incrementally with each count, and then cycles or resets and generates another ramp. Each column has a comparator 22 with each comparator 22 having one input receiving the ramp signal AnalogRamp from the DAC and another input receiving the analog pixel value from the associated pixel amplifier 14. The comparator 22 changes state, e.g., from "0" to "1", as soon as the ramp signal level equals or exceeds the pixel voltage from the associated pixel amplifier 14. Each column also has a digital latch circuit 24, and has a count input coupled to the counter bus 18 and a latching input coupled to the output of the associated column comparator 22. The latch circuits 24 each capture and store the count from the N-bit counter 16 at the moment that the ramp voltage equals the pixel voltage. Then this count is transferred as a digital pixel value, column by column, to a video readout bus. Column select switches 30 are gated one at a time in response to respective column select signals, so that the digital signal appearing on the readout bus 28 corresponds to the analog value of the video provided by the respective pixels. This digital video signal has numerous advantages as mentioned before over analog video processing.

The analog ramp is generated by a counter and an N-bit DAC 16 and compared to the video voltage from the pixel amplifiers throughout the entire array. Each comparator 22 makes the associated latch 24 transparent if the analog ramp voltage is below the pixel amplifier signal, so that when the analog ramp has passed the particular pixel amplifier voltage, the corresponding latch 24 holds the count value that was present when the ramp voltage was equal to the amplifier voltage. In this digitizing scheme conversion time of $2^N$ cycles is required, as compared to N cycles in a SAR-DAC. Glitch removal (to prevent latching when the counter is changing) is not shown in this diagram.

The comparator 22 can be a simple open loop operational amplifier, but preferably have a registered structure or hysteresis to avoid noise jitter on the output to accidentally latch the counter bus 18 during counter transitions causing erroneous conversion. Alternatively, the comparator functionality can be performed by a modification to the ACS buffer or to other amplifier structure. It is beyond the scope of this invention to present modern comparator structures that minimizes comparator offset errors (output transitions at a fixed voltage difference between the negative and positive inputs) or avoids output jitter (comparator output transitions when inputs are stable due to temporal or system noise). In this context, a comparator can be any means of comparing two voltages to produce a controlling signal. The pixel or column amplifier 14 is intended to reference any single pixel or column of pixels that provides a voltage or sequence of voltages corresponding to the amount of incoming light during the exposure time.

As mentioned before, the pixels 12 in the array can physically be one pixel or a column of pixels feeding the associated column amplifier 14 that converts the signal from the pixels to a voltage. The amplifiers 14 (or alternatively the pixels 12) can be reset to a black level, and sampled-and-held to maintain a constant output voltage independent of the incoming light. The comparators 20 compare the held voltage to the analog ramp voltage and their outputs controlling a respective one of the digital latches 24. The comparator output is applied as a latch-enable, LE. If LE is low, the latch 24 is transparent according to the implementation above. The latches 24 can be sequentially read out after the conversion has completed on a digital video bus by pulsing the Col_Select signals in the correct sequence.

Figure 2B:
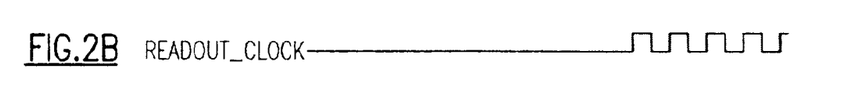
Figure 2C:
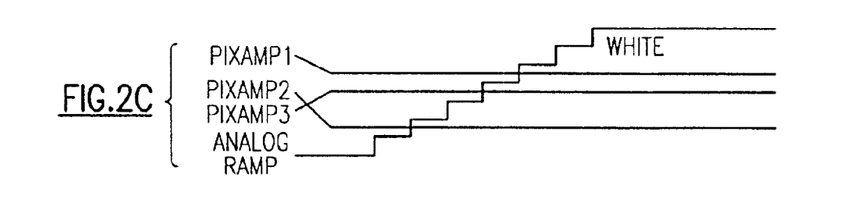
Figure 2D:
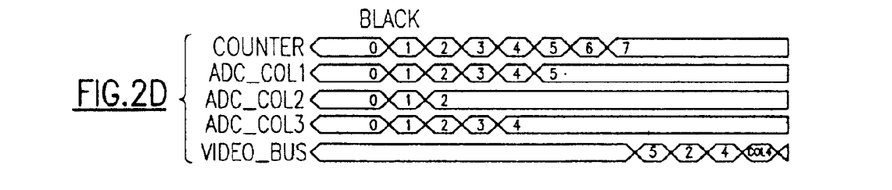
Figure 4A:
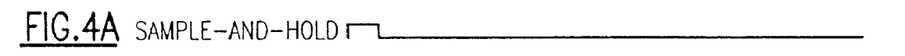
FIGS. 4A to 4G are signal charts for explaining the operation of this embodiment.
Figure 4B:
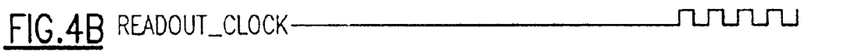
Figure 4C:
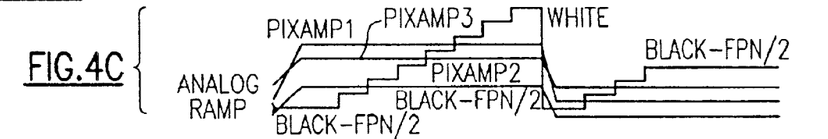
Figure 4D:
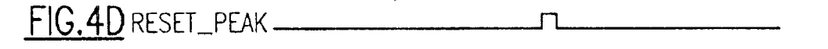
Figure 4E:
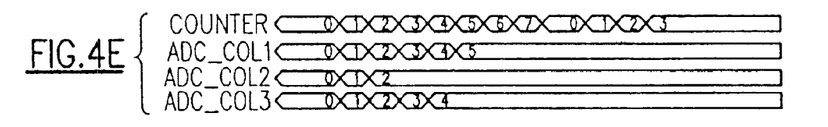

The operation of this arrangement can be explained in FIGS. 2A, 2B, 2C and 2D. These charts show schematically and on a small scale, the operation of the imager 10, and the waveform diagrams shows an example of a 3 bit ADC where three amplifier voltages "PixAmp" are sampled-and-held to maintain a constant voltage. A sample-and-hold signal (FIG. 2A) is applied to the pixel amplifiers 14. All the pixel amplifiers 14 across the array change during the time of that pulse to their new pixel value. Once the amplifier voltages are held, the counter starts counting from 0 to $2^N$ −1 and the resulting ramp voltage (AnalogRamp—FIG. 2C) is compared to the held voltages throughout the array to latch the counter value. In the example above, three of the amplifiers output respective pixel voltages, namely PixAmp1, PixAmp2 and PixAmp3, as shown in FIG. 2C, and these digitize respectively: PixAmp1 digitizes to "5", PixAmp2 to "2" and PixAmp3 to "4". External gating (or timing), as shown in FIG. 4D, of the "LE" will determine if the counter value before or after the ramp has passed should be latched and at the same time prevent glitches from skewed latching of a count that is in the process of changing (not shown). Once all $2^N$ cycles of the AD-Conversion has completed, the contents of the latches can be sequentially read out on the resulting video bus (shown as Readout_Clock—FIG. 4B).

One of the major problems in image sensors is the fixed pattern noise or FPN, which is due to fixed offset variations. According to another aspect of this invention, a scheme for reducing or eliminating FPN is presented here which re-utilizes the very same portions of the circuit for compensating for those offset variations. The amplifier voltages can be considered as a sum of the video signal, the black level and FPN. Where the video signal is dependent only on the light on the pixel, the black level is constant throughout the array, and FPN is the variation in offsets across the array. When the pixel is reset, the video signal gets removed from the sum that constitutes the pixel output. The black level plus offset at the time of reset can be subtracted from the respective pixel output to compensate for the offset and thus remove the FPN. This can be carried out digitally by taking the digital value of the pixel output and subtracting the digital value of the offset. The FPN is of far smaller dynamic range than the video signal, so if the AD-conversion is run again after the pixels or amplifiers has been reset, the FPN can latched separately and digitally subtracted from the digitized video during read-out. The FPN latching can be carried out in a significantly smaller number of clock cycles. One of the major benefits to the lower dynamic range of the FPN is that the counter only has to make a ramp from black-FPN/2 to black+FPN/2 and therefore uses a small fraction of N bits, i.e., "M" in the diagram below.

Figure 3:
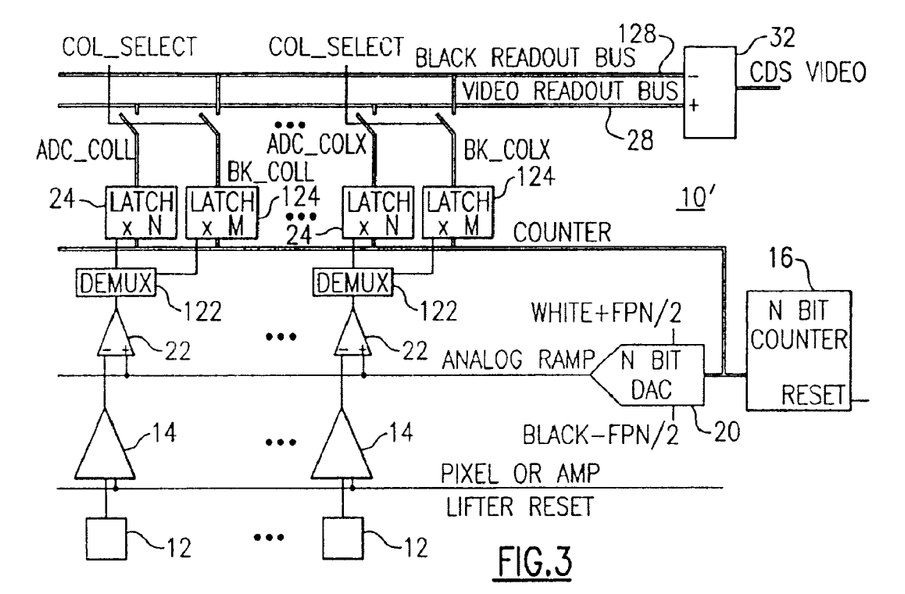
FIG. 3 is a schematic circuit diagram of another embodiment of this invention.

As shown in FIG. 3, an embodiment of the imager 10" is adapted for compensation for fixed pattern noise or FPN, and as with the previous embodiment employs an array of pixels 12, arranged in columns with associated pixel amplifiers 14, an N-bit counter 16, a counter output bus 18, an N-bit DAC 20 which outputs an analog ramp, column comparators 22, and video latch elements 24, which perform as described in relation to the embodiment of FIG. 1. In addition, there is another set of latch elements 124 which latch the contents of the N-bit counter 16 during reset to store a digital representation of the column pixel and pixel amplifier offset. To this end, there is a de-multiplexer 122 situated between the comparator 22 of each column and LE inputs of the associated video latch element 24, which is an N-bit latch, and of the associated offset latch element 124, which may be a smaller, M-bit latch. The outputs of the latches 24 are sequentially fed to the video readout bus 28, and those of the latches 124 are fed to a black readout bus 128. These both lead to a digital subtraction element 32, which outputs an offset-corrected video or CDS digital video signal.

Figure 4F:
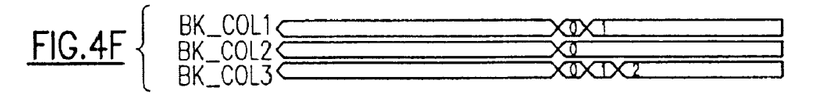
Figure 4G:
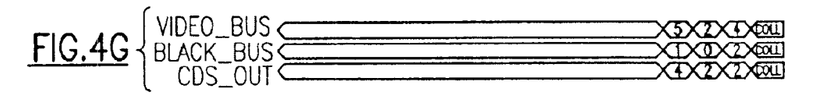

This embodiment, which employs this CDS scheme may be explained in the waveform diagrams of FIGS. 4A to 4G, where a 3 bit video digitizing (FIG. 4C) is followed by a 2 bit FPN digitizing. Sample-and-hold signal (FIG. 4A) and Readout_Clock signals (FIG. 4B) occur at the times shown, as described in connection with the first embodiment. The video outputs are subject to the clocked counter output COUNTER (FIG. 4E) and are latched as indicated as digital values ADC-Col1, ADC_Col2, and ADC_Col3. Once the video digitizing has completed, the pixels 12 (and/or pixel amplifiers 14) are reset (FIG. 4D) to the [black level+FPN] (FIG. 4C) and those voltages compared with the AnalogRamp voltage, and are digitized into respective latch elements 124, as indicated as digital values Blk_Col1, Blk_Col2, and Blk_Col3 (FIG. 4F). The ADC_Colx and Blk_Colx are read out simultaneously and fed to the digital subtraction element 32 to remove the black_level+FPN from the video_signal+black_level+FPN and thus output only the pure video signal. Because of the reduced number of bits used in the black digitizing, very few clock cycles are added to the overall line time to achieve FPN reduction.

The CDS described is DS and not true CDS; true CDS requires the black level to be digitized before pixel exposure and stored until used for subtracting from the later digitized video signal. The digital latches, being noise free and consuming virtually no power, constitute excellent memory cells and provide a linear sensor method of resetting the pixels while digitizing and storing the black level. Then pixel exposure can be carried out, holding the amplifier output. The amplifier output is subsequently digitized and combined with the previously stored black values. This subtracts the black level and offset from each corresponding digitized video level, to yield a true CDS solution. In previous area sensors the black levels have had to be stored for the entire array and not just a line at a time. But here, since the black levels are already in digital form, true CDS can be implemented using a memory array for storing of only M-bits per pixel during pixel reset.

Figure 5:
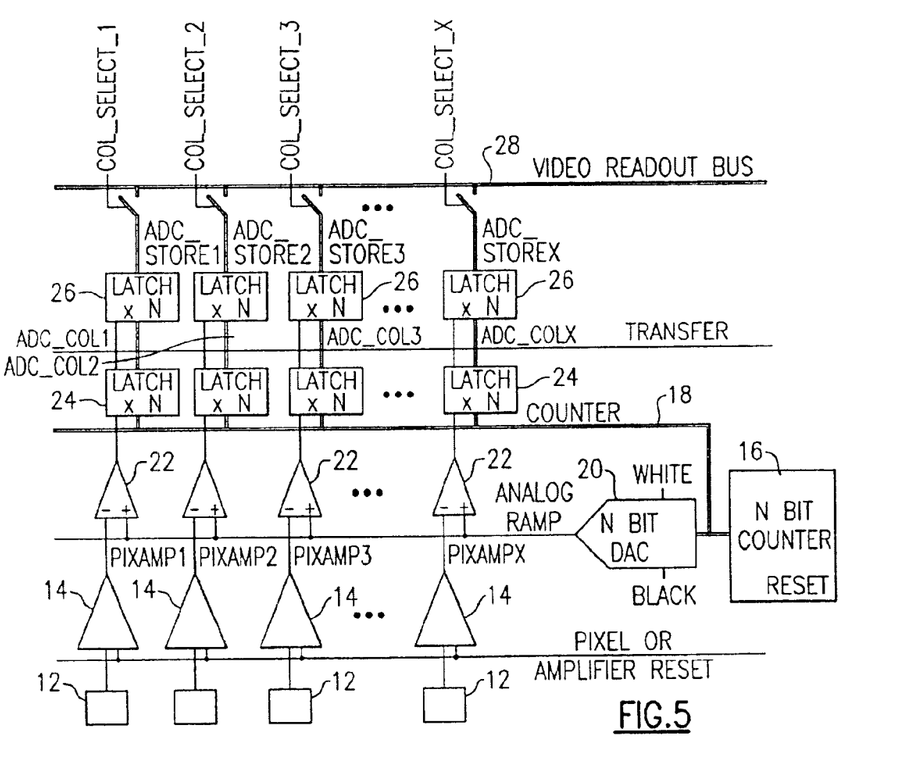
FIG. 5 is a schematic circuit diagram of a another embodiment of this invention.

Another embodiment is illustrated in FIG. 5, in which a second layer of latching hides the conversion time of $2^N$ clock cycles. The same elements that are present here as in the previous embodiments are identified with the same reference numbers, and a description of those elements can be omitted. A second level latches 26 is introduced here to pipeline the video level latches 24 at the end of a conversion cycle. Here, the second latches 26 are latched in response to a transfer update signal Transfer. In other words, the first layer digital video latches 24 can convert the video levels during the above-described conversion time ($2^N$ clock cycles) simultaneously with the readout of converted video levels from the previous row or line is being readout, i.e., from the second level latches 26. This enables the $2^N$ clock cycle conversion time to be hidden during readout and the line-overhead time (i.e. the time slot between reading out the last pixel in one row to the first pixel in the next) can be greatly minimized or even made negligible.

Figure 6A:
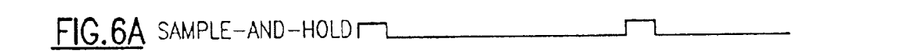
FIGS. 6A to 6F are signal charts for explaining the operation of this embodiment.
Figure 6B:
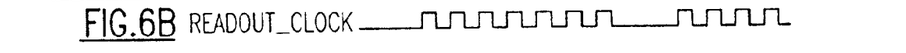
Figure 6C:
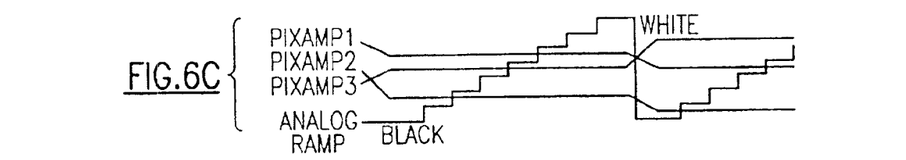
Figure 6D:
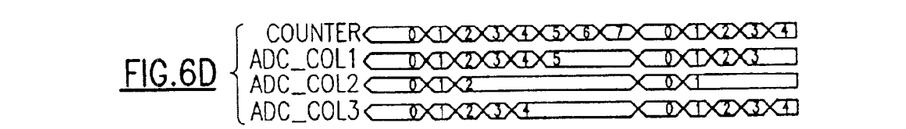
Figure 6E:
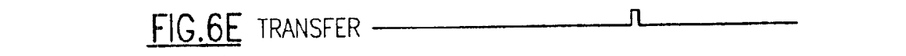
Figure 6F:
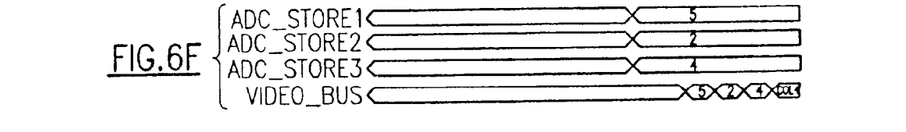

With this embodiment the Sample-and-Hold signal (FIG. 6A), Readout_Clock (FIG. 6B), PixelAmp1, -2, -3, and AnalogRamp signals (FIG. 6C), Counter and ADC_Col1, -2, and -3 (FIG. 6D) appear as in the FIG. 1 and FIG. 2 embodiment. After the first conversion line or field of video is converted, the transfer signal (Transfer—FIG. 6E) occurs to actuate the latches 26 and transfer to the latches 26 the contents of the video level latches 24, which all contain the A/D converted digital levels corresponding to all the pixels 12 or column amplifiers 14. The second level latches 26 are sequentially selected onto the video level bus 28 during the same time when the next video line or field is converted (FIG. 6C). That is, while the next row of pixels 12 or column amplifier 14 voltages are being converted, the previous line of digital values ADC_Store1, ADC_Store2, ADC_Store3 are transfered to Video_Bus (FIG. 6F).

If an N-bit DAC is used as a ramp generator it will be possible to run the counter in increments of 2Y and get an bit ADC that converts in clock cycles. For instance if a 16-bit DAC is used as a ramp generator, 16-bit digitizing of every pixel in 64K clock cycles is done by counting in increments of 1. If the counter increments by $2^8$(0, 256, 512 . . . ), 8-bit digitizing of every pixel in 256 clock cycles can be done with the same hardware. Counting by increments of $2^4$(0, 16, 32 . . . ) will give get 12-bit digitizing in 4K clock cycles. This scheme makes one device flexible enough to digitize fast with low resolution and slow with high resolution.

Figure 7:
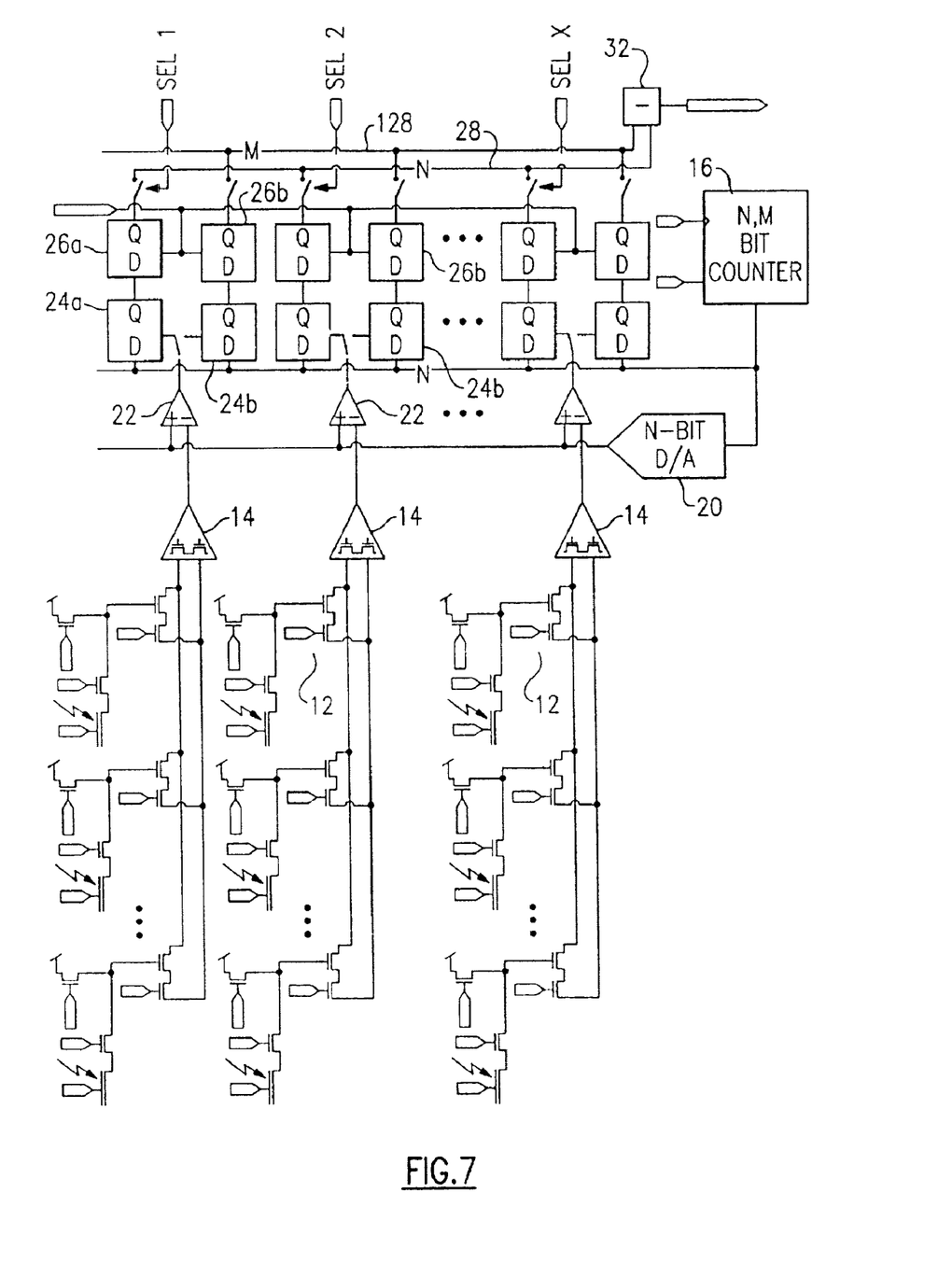
FIG. 7 is a circuit diagram of a of another embodiment.

FIG.7 is a preferred embodiment according to this invention for an area sensor, where features of both the FIG. 3 and FIG. 5 embodiments are incorporated. The elements that are in common with the previous embodiments are identified with the same reference numbers and a detailed description of those elements is omitted. There are both video level latches 24a and black level latches 24b as well as second-level latches 26a and 26b, to pipeline the conversion stage and allow both temporal and offset compensation conversion while reading out the black and video levels from the previous row. The conversion time for this preferred embodiment is $2^N+2^M$ clock cycles, but this time is hidden behind the second level latches and is simultaneous with the readout time.

Figure 8:
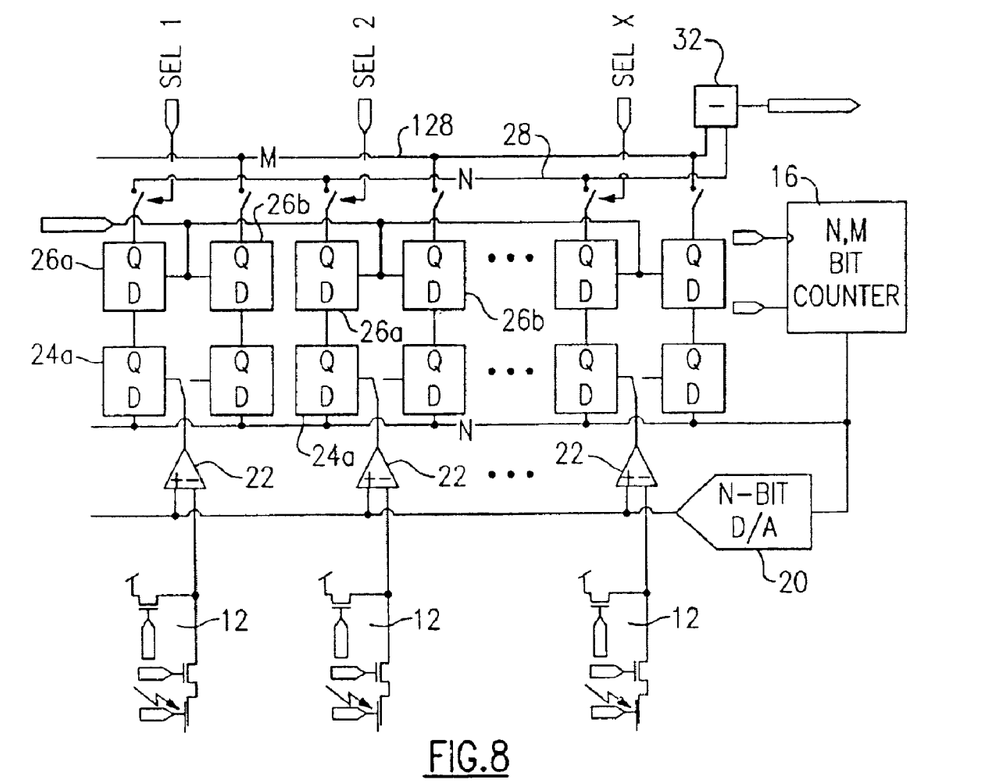
FIG. 8 is a diagram of an linear imager of this embodiment.

FIG. 8 is another embodiment according to this invention, here shown for a linear sensor, where the sense nodes from the pixels 12 are applied directly to the inputs of the FIG. 8 is another embodiment according to this invention, here shown for a linear sensor, where the sense nodes from the pixels 12 are applied directly to the inputs of the comparators 22, i.e., are identical to the comparator input signals, so as to reduce the amount of circuitry and power consumption. In this embodiment, the column amplifiers 14 are absent. The remaining elements are as identified in the previous embodiments.

Figure 9:
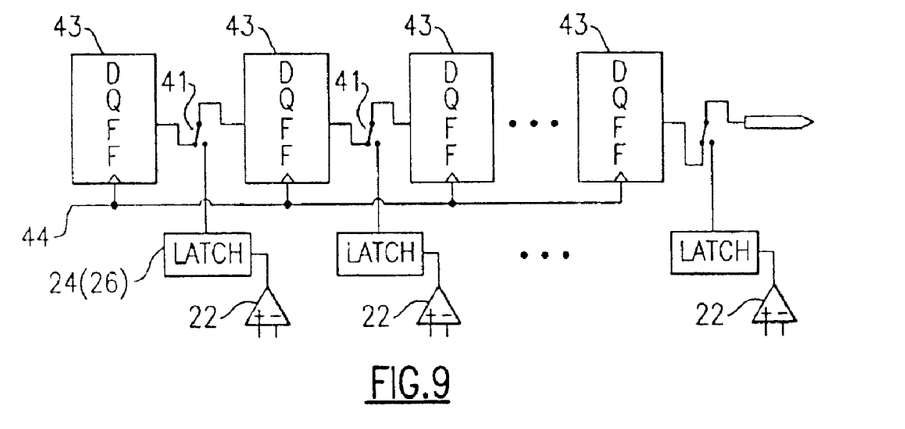
FIG. 9 is a diagram of another embodiment.

FIG. 9 is an alternative implementation of a digital readout structure, where sequential select signals are omitted and replaced by a column-wide-signal similar to the update signal Transfer controlling a selector switch 41. The black and/or video level latches (both represented by a single latch 42) are read into a set of DQ flip-flops 43, either static or dynamic, and the black/video levels are shifted from one DQFF 43 to the next using the readout clock signal 44. The advantage of this technique is that there are no wide digital busses to multiplex and thus the readout speed can thus be much higher.

Digital post-processing algorithms can achieve to have a higher bit resolution in some picture areas of interest and a lower resolution in the areas of less interest. This can be accomplished with with the circuitry of this invention, where the counter is incrementing by one step at a time within some range of certain count values, the count increment is doubled in another range of count values, and increment is doubled again in some other range of count values, and so on. This gives the digitized values a resolution of for instance 16 bits near black, 15 bits at dark, 12 bits at gray and 8 bits at white with a resulting conversion time being much lower than 64K clock cycles. For high N- and M-values, the conversion time can become long. This time can be greatly reduced by reducing the resolution for portions of the image where high resolution is unimportant. The higher resolution areas can be in the gray areas, or in the bright areas, depending upon the particular application.

Figure 10:
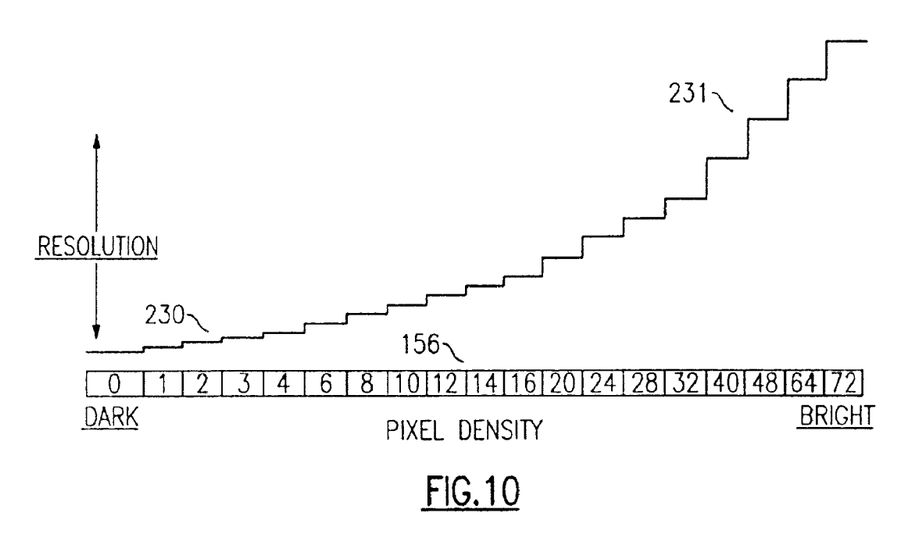
FIG. 10 and FIG. 11 are charts for explaining non-linear implentations of this invention.

FIG. 10 illustrates a technique for shortening the conversion time, in which the counter 16 can be made to count in incremented steps causing the bit resolution to be highest near black (e.g. 16-bits) and reduce as the pixel converted gets brighter (e.g. 10-bits). Conversion is linear, but the result is a digital video with intentional missing codes at brighter pixels. This embodiment is preferable in cases where the video is subjected to a subsequent gain stage (white balance, color convolution or other) or gamma lookup table (optional black-level sampling for CDS is not shown).

Figure 11:
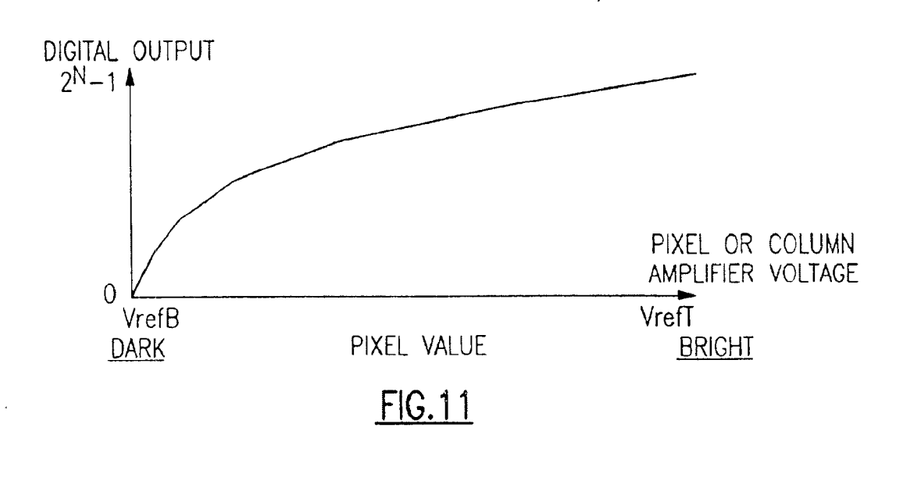

FIG. 11 illustrates another alternative technique and shows the output of the ADC per column when the DAC 20 has exponential voltage output while the counter 16 provides a linear count. The result is a digital video output that is gamma-corrected. Other embodiments with non-linear counter to DAC relationships are also possible in the present invention.

Figure 12:
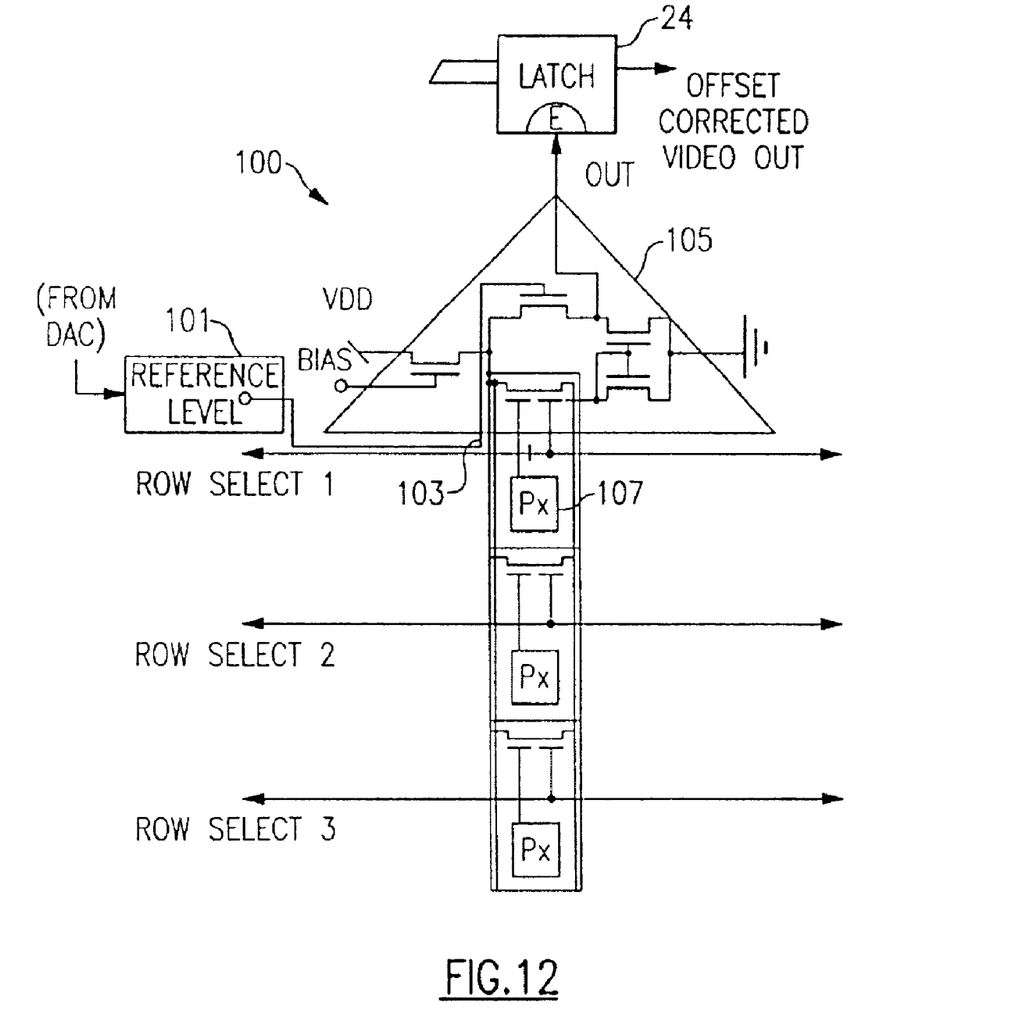
FIG. 12 is a schematic circuit diagram of another embodiment of this invention.

Referring to FIG. 12, another particular embodiment employs an active column sensor device 100 (as detailed in U.S. Pat. No. 6,084,229) which is reconfigured to serve as a comparator with respect to a reference level source 101. In this embodiment the feedback path for the active column sensor (e.g., as explained in respect to FIG. 2 of U.S. Pat. No. 6,084,229) is removed and the reference signal or reference level source 101 is coupled to one of the inputs 103 of an associated operational amplifier 105. The remainder of the active column sensor 100, such as the internal components and operation of the amplifier 105 and the pixels 107, by way of example only, are the same as described in U.S. Pat. No. 6,084,229, which is incorporated herein by reference and need not be described here. When an input or collected signal is received from the pixel 107, the active column sensor is reconfigured to be compared to a reference signal provided by the reference level source 101. The difference between the two input signals is amplified by the open loop gain of the amplifier 105, causing the output to slew to the most positive or most negative limits of the amplifier 105. A comparator is often used as the first stage in some analog-to-digital converter architectures. Although in the particular embodiment the output reconfiguration circuit is a reference level source 101, other types of output reconfiguration circuits may also be used, such as an integrator circuit or circuit with gain, by way of example only. The ramp AnalogRamp from the DAC 20 would serve as the reference level for the the reference level source 101.

With many types of digital post-processing algorithms (e.g. digital gain and gamma correction) it is advantageous to have a higher bit resolution near black and lower bit resolution near white. This can be accomplished with the same hardware as described in the previous paragraph where the counter is incrementing by 1 up to a certain count value where the count increment is doubled until a next count where the increment is doubled again and so on. This makes the digitized values have a resolution of for instance 16-bits near black, 15-bits at dark, 12-bits at gray and 8-bits at white with a resulting conversion time being much lower than 64K clock cycles.

Other ways to speed up read-out can employ multiple parallel video busses: One implementation could use one digital video bus for all odd pixels and one for all even pixels. Another could use one bus for pixels 1 to Y, one for Y+1 to 2*Y, and so on. Then, the digital values can be multiplexed onto one single video stream just before sending it off chip.

A significant advantage of a working with the video signals in digital form is that the busses can be separated by a latch or flip/flop to pipeline the video signal and thus decrease the readout time to the time it takes to charge only one level of the bus.

While this invention has been described in connection with selected preferred embodiments, it should be apparent that the invention is not limited only to those embodiments, but that many variations and equivalents would present themselves to those skilled in the art, and would not depart from the scope and spirit of this invention, as defined in the appended claims.

We claim:

1. Arrangement for converting analog pixel values from an array of pixels to a digital video signal, said array comprising a plurality of columns and at least one row, each column having at one pixel therein, and each column providing a respective pixel value; the arrangement comprising
   an N-bit counter;
   an N-bit DAC connected to said counter and having a ramp output providing a signal corresponding to a count existing on said counter;
   a plurality of digital storage elements each associated with a respective one of said columns;
   a counter bus connecting an output of said counter to inputs of said digital storage elements;
   a plurality of comparators each associated with a respective one of said columns, and having one input connected to receive the respective column pixel value, another input connected to the ramp output of said N-bit counter, and a comparator output connected to a gating terminal of the respective digital storage element;
   a video readout bus; and
   means selectively transferring contents of said digital storage elements to said video output bus to produce said digital video signal.

2. Arrangement of claim 1 wherein each said digital storage element is a latch element.

3. Arrangement of claim 1 further comprising a plurality of black-level readout latch elements, each associated with a respective one of said columns; each black level readout latch element having a latch input connected to said counter bus and a gating terminal connected to the respective comparator output; a black-level readout bus; means for transferring the contents of the respective black-level latch elements to the black-level readout bus simultaneously with the transfer of the contents of the associated digital storage elements to said video readout bus; and a subtraction element connected to the video readout bus and the black-level readout bus.

4. Arrangement of claim 1 wherein said digital storage elements each include a first latch member having an input connected to said counter bus, and a buffer latch member, having an input connected to an output of the respective first latch member, a gate terminal, and an output connected to the video readout bus; and means providing a transfer signal to the gate terminals of said buffer latch members.

5. Arrangement of claim 1, wherein said video readout bus comprises a sequence of DQ flip-flops.

6. Arrangement for converting analog pixel values from an array of pixels to a digital video signal, said array comprising a plurality of columns and at least one row, each column having at one pixel therein, and each column providing a respective pixel value; the arrangement comprising an N-bit counter; an N-bit DAC connected to said counter and having a ramp output providing a signal corresponding to a count existing on said counter; a plurality of digital storage elements each associated with a respective one of said columns; a counter bus connecting an output of said counter to inputs of said digital storage elements; a plurality of comparators each associated with a respective one of said columns; wherein each comparator is made up of a plurality of differential-input amplifiers, each of the differential amplifiers having a plurality of first input transistors, one of the first input transistors being located at each of the pixels within the periphery, and a second input transistor being located outside the periphery of the array and coupled to the first input transistors and to an output configuration circuit, and having one input connected to receive the respective column pixel value, another input connected to the ramp output of said N-bit DAC, and a comparator output connected to a gating terminal of the respective digital storage element; a video readout bus; and means selectively transferring contents of said digital storage elements to said video output bus to produce said digital video signal.

7. Arrangement of claim 6 wherein each said digital storage element is a latch element.

8. Arrangement of claim 6 further comprising a plurality of black-level readout latch elements, each associated with a respective one of said columns; each black level readout latch element having a latch input connected to said counter bus and a gating terminal connected to the respective comparator output; a black-level readout bus; means for transferring the contents of the respective black-level latch elements to the black-level readout bus simultaneously with the transfer of the contents of the associated digital storage elements to said video readout bus; and a subtraction element connected to the video readout bus and the black-level readout bus.

9. Arrangement of claim 6 wherein said digital storage elements each include a first latch member having an input connected to said counter bus, and a buffer latch member, having an input connected to an output of the respective first latch member, a gate terminal, and an output connected to the video readout bus; and means providing a transfer signal to the gate terminals of said buffer latch members.

10. Arrangement of claim 6, wherein said video readout bus comprises a sequence of DQ flip-flops.

* * * * *

UNITED STATES PATENT AND TRADEMARK OFFICE
CERTIFICATE OF CORRECTION

PATENT NO.   : 6,965,407 B2
DATED        : November 15, 2005
INVENTOR(S)  : Christian Boemler et al.

It is certified that error appears in the above-identified patent and that said Letters Patent is hereby corrected as shown below:

Column 2,
Line 5, insert the following between "or" and "placing":
-- impossible to achieve proper device matching by the usual technique making large devices, --.

Signed and Sealed this

Twenty-fourth Day of January, 2006

JON W. DUDAS
*Director of the United States Patent and Trademark Office*